United States Patent [19]
Matsumoto et al.

[11] Patent Number: 6,034,549
[45] Date of Patent: Mar. 7, 2000

[54] LEVEL SHIFT CIRCUIT

[75] Inventors: Toshiyuki Matsumoto; Yoshihiro Hirota, both of Osaka, Japan

[73] Assignee: Sumitomo Metal Industries, Ltd., Osaka, Japan

[21] Appl. No.: 08/960,626

[22] Filed: Oct. 29, 1997

[30] Foreign Application Priority Data

Oct. 30, 1996 [JP] Japan ................................. 8-288696
Sep. 19, 1997 [JP] Japan ................................. 9-255178

[51] Int. Cl.$^7$ .............................................. H03K 19/0175
[52] U.S. Cl. ................................................ 326/68; 326/80
[58] Field of Search ................................. 326/80, 81, 68, 326/83, 86, 121

[56] References Cited

U.S. PATENT DOCUMENTS

| | | | |
|---|---|---|---|
| 4,150,308 | 4/1979 | Adlhoch ......................... | 307/264 |
| 4,626,704 | 12/1986 | Takata et al. . | |
| 4,642,488 | 2/1987 | Parker . | |
| 4,675,557 | 6/1987 | Huntington . | |
| 4,724,343 | 2/1988 | Le Roux et al. . | |
| 5,206,544 | 4/1993 | Chen et al. . | |
| 5,381,060 | 1/1995 | Ainspan et al. . | |

FOREIGN PATENT DOCUMENTS

| | | |
|---|---|---|
| 58-151124 | 9/1983 | Japan . |
| 60-105320 | 6/1985 | Japan . |
| 62-57318 | 3/1987 | Japan . |
| 62-66716 | 3/1987 | Japan . |
| 62-190923 | 8/1987 | Japan . |
| 63-502858 | 10/1988 | Japan . |
| 2-301323 | 12/1990 | Japan . |
| 7-30402 | 1/1995 | Japan . |
| 7-226670 | 8/1995 | Japan . |
| 8-18433 | 1/1996 | Japan . |

*Primary Examiner*—Michael Tokar
*Assistant Examiner*—Peguy JeanPierre
*Attorney, Agent, or Firm*—Burns, Doane, Swecker & Mathis, LLP

[57] ABSTRACT

A level shift circuit consisting MOSFETs is provided which comprises at least two bias voltage supply circuits and a driver circuit cascaded between input and output terminals of the level shift circuit. The first stage of the bias voltage supply circuits receives an input voltage and the last stage thereof supplies a level-shifted voltage to the driver circuit. The driver circuit includes N- and P-channel transistors. Gates of the transistors of the driver circuit receive the level-shifted voltage from the bias voltage supply circuits and the input voltage, respectively. Sources of the transistors of the driver circuit are commonly connected to the output terminal to provide an output voltage.

13 Claims, 3 Drawing Sheets

LEVEL SHIFT CIRCUIT

BACKGROUND OF THE INVENTION

The present invention relates to a level shift circuit, and more particularly to a level shift circuit which is composed of MOSFETs or a combination of MOSFETs and electric resistive elements and is capable of appropriately setting a level shift amount.

Description of Prior Art

FIG. 1 illustrates a prior art level shift circuit described in Japanese Patent Public Disclosure (Kokai) No. 8-18433, which is capable of setting a level shift amount. The illustrated circuit has first and second inverters $I_1$ and $I2$ (called as "ratio type inverters"), each having P- and N-MOSFETs and represented by the same circuit diagram. In each of these inverters $I_1$ and $I_2$, a P-channel transistor 33 or 35 has a gate and a drain connected to each other and a source connected to a power supply VDD, and an N-channel transistor 34 or 36 has a gate and a drain respectively configured to serve as an input and output terminals of the own inverter $I_1$ or $I_2$ and a source connected to a ground. In each of the inverters $I_1$ and $I_2$, the drains of the P- and N-channel transistors are connected.

In the level shift circuit shown in FIG. 1, when an input voltage $V_i$ is supplied to the first inverter $I_1$, the voltage is shifted at two stages (or by the first and second inverters) and then delivered from the level shift circuit as an output voltage $V_o$. The output voltage $V_o$ is expressed by the following equation:

$$V_o = \sqrt{\{(\beta_{n1}\beta_{n2})/(\beta_{p1}\beta_{p2})\}} \cdot V_i + \{1 - \sqrt{(\beta_{n2}/\beta_{p2})}\} \cdot (V_{dd} + V_{tp}) - [\sqrt{\{(\beta_{n1}\beta_{n2})/(\beta_{p1}\beta_{p2})\}} - \sqrt{(\beta_{n2}/\beta_{p2})}] \cdot V_{tn} \quad (1)$$

where $\beta_{p1}$: Gain coefficient of P-channel transistor 33;

$\beta_{n1}$: Gain coefficient of N-channel transistor 34;

$\beta_{p2}$: Gain coefficient of P-channel transistor 35;

$\beta_{n2}$: Gain coefficient of N-channel transistor 36;

$V_{dd}$: Voltage of power supply VDD;

$V_{tp}$: Threshold voltage of each of P-channel transistors 33, 35; and $V_{tn}$: Threshold voltage of each of N-channel transistors 34, 36.

Assuming that the P-channel transistors 33, 35 and the N-channel transistors 34, 36 are formed to satisfy the following equation:

$$\beta_{n1}/\beta_{p1} = \beta_{p2}/\beta_{n2} \quad (2)$$

In this case, Equation (1) is transformed to the following Equation (3), where the second term of the right side represents a level shift amount $V_{sh}$ of the circuit shown in FIG. 1:

$$V_o = V_i + \{1 - \sqrt{(\beta_{p1}/\beta_{n1})}\} \cdot (V_{dd} + V_{tp} + V_{tn}) \quad (3)$$

$$\therefore V_{sh} = \{1 - \sqrt{(\beta_{p1}/\beta_{n1})} \cdot (V_{dd} + V_{tp} + V_{tn}) \quad (4)$$

It can be seen from Equation (4) that the level shift amount $V_{sh}$ can be determined depending on the ratio $\beta_{p1}/\beta_{n1}$ of the gain coefficients of the two transistors 33, 34 forming the first inverter $I_1$. In this event, from Equation (2), $$\beta_{p1}/\beta_{n1} = \beta_{n2}/\beta_{p2} \quad (5)$$

is derived. Therefore, when $\beta_{p1}/\beta_{n1}$ in Equation (4) is changed to vary the level shift amount $V_{sh}$, the ratio $\beta_{n2}/\beta_{p2}$ of the gain coefficients of the two transistors 35, 36 forming the second inverter $I_2$ must be necessarily changed to satisfy Equation (5).

Generally, when a channel width and a channel length of a MOS transistor are respectively represented by W and L, and a gain coefficient of a process is represented by K', a gain coefficient $\beta$ of the transistor is expressed by:

$$\beta = 2K'W/L \quad (6)$$

It can be seen from the foregoing, especially from Equations (4) and (6) that the level shift amount $V_{sh}$ can be appropriately settled by properly selecting the channel width W and the channel length L of each of the transistors constituting the first and second inverters. It should be noted however that Equation (2) must be satisfied in the selection.

The prior art level shift circuit illustrated in FIG. 1 is composed of the cascaded first and second inverters of the ratio type, in which the level shift amount $V_{sh}$ is determined based on the ratio of the gain coefficients of the transistors forming the inverters. Therefore, when a certain input voltage $V_{in}$ is supplied to the level shift circuit to output a level-shifted output voltage $V_o$, a DC current determined by the gain coefficients constantly flows from the power supply VDD to the ground through each of the first and second inverters, thereby resulting in a problem that electric power consumed by the level shift circuit is relatively large.

SUMMARY OF THE INVENTION

In view of the above problems of the prior art, the present invention has been made to provide a level shift circuit which is capable of readily setting a level shift amount to a desired value as well as reducing electric power consumption of the level shift circuit.

To achieve the above object, the present invention provides a Level shift circuit consisting MOSFET transistors for shifting a level of an input voltage supplied to an input terminal thereof, and outputting a level shifted output voltage from an output terminal thereof, comprising: (a) driver means including a first transistor of a first channel type and a second transistor of a second channel type, wherein the first transistor is serially connected with the second transistor, a gate of the first transistor is connected to the input terminal, and sources of the first and second transistors are connected to the output terminal; and (b) first bias voltage supply means connected to the input terminal and to a gate of the second transistor, for shifting the level of the input voltage to supply the level shifted voltage to the gate of the second transistor.

In a preferred embodiment of the present invention, the first bias voltage supply means includes a number m (M≧2) of circuits cascaded between the input terminal and the gate of the second transistor, wherein the bias voltage supply circuit at each stage comprises a series connection of a first resistive element functioning as a load resistor, a transistor of the first channel type, and a second resistive element functioning as an electric resistor, a gate of the transistor of the first stage circuit is connected to the input terminal, a connection point between a source of the transistor and the first resistive element of the i-th (i=1, 2, . . . , m−1) stage circuit is connected to a gate of the transistor of the (i+1)-th stage circuit, and a connection point between a source of the transistor and the first resistive element of the m-th stage circuit is connected to the gate of the second transistor of the driver means.

When the first channel type is a P-channel and the second channel type is an N-channel, a drain of the second transistor is connected to a positive terminal of a power supply voltage. Conversely, when the first channel type is an N-channel and the second channel type is a P-channel, a drain of the second transistor is connected to a negative terminal of a power supply voltage.

The first and second resistive elements respectively comprise P- and N-channel transistors, each having a gate and a drain connected to each other, or respectively comprise N- and P-channel transistors, each having a gate and a drain connected to each other. Further, the driver means may also include a third resistive element connected in series with a drain of the first transistor. The third resistive element comprises a P-channel or an N-channel transistor having a gate and a drain connected to each other.

In a further preferred embodiment of the present invention, when the first channel type is a P-channel and the second channel type is an N-channel, the level shift circuit further includes second bias voltage supply means having m (m≧2) stage circuits inserted between the input terminal and a gate of the first transistor. Each stage circuit of the second bias voltage supply means includes a series connection of a fourth resistive element functioning as a load resistor, an N-channel transistor, and a fifth resistive element functioning as an electric load. A gate of the transistor of the first stage circuit is connected to the input terminal, a connection point between a source of the transistor and the fourth resistive element of the i-th (i=1, 2, ..., m−1) stage circuit is connected to a gate of the transistor of the (i+1)-th stage circuit, and a connection point between a source of the transistor and the fourth resistive element of the m-th stage circuit is connected to the gate of the first transistor. In the second bias voltage supply means, the fourth resistive element comprises a P-channel transistor having a gate and a source connected to each other, and the fifth resistive element comprises an N-channel channel transistor having a gate and a source connected to each other.

DETAILED DESCRIPTION OF PREFERRED EMBODIMENTS

The present invention will hereinafter be described in connection with preferred embodiments thereof with reference to FIGS. 2, 3 and 4.

Figure 2:
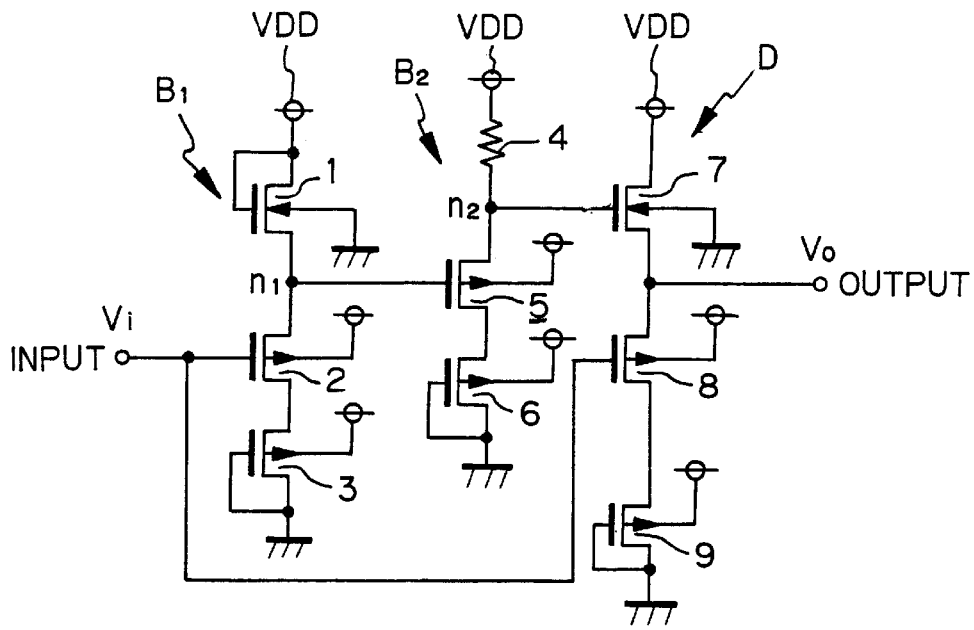
FIG. 2 is a circuit diagram illustrating a first embodiment of a level shift circuit according to the present invention.

Referring first to FIG. 2 which illustrates a first embodiment of a level shift circuit according to the present invention, the level shift circuit comprises a first bias voltage supply circuit $B_1$, a second bias voltage supply circuit $B_2$, and a driver circuit D, where these three circuits are substantially cascaded in this order between an input terminal INPUT and an output terminal OUTPUT.

The first bias voltage supply circuit $B_1$ includes an N-channel transistor 1, a P-channel transistor 2, and a P-channel transistor 3. These are connected in series between a power supply VDD and a ground. The N-channel transistor 1, which functions as a load resistor of the first bias voltage supply circuit $B_1$, has a gate and a drain commonly connected to the power supply VDD and a source connected to a source of the P-channel transistor 2. The connection point between the sources of the transistors 1 and 2 forms an output node $n_1$ of the first bias supply circuit $B_1$. The P-channel transistor 2 receives an input voltage $V_i$ at its gate and has a drain connected to a source of the P-channel transistor 3. A gate and drain of the P-channel transistor 3 are commonly connected to the ground, and the transistor 3 functions as a resistive element having a predetermined resistance value.

The second bias voltage supply circuit $B_2$ includes a load resistor 4, a P-channel transistor 5, and P-channel transistor 6. These are connected in series between the power supply VDD and the ground. The load resistor 4 has one end connected to the power supply VDD and the other end connected to a source of the P-channel transistor 5, the connection point of which forms an output node $n_2$ of the second bias voltage supply circuit $B_2$. The P-channel transistor 5 has a gate connected to the output node $n_1$ of the first bias voltage supply circuit $B_1$, and a drain connected to a source of the P-channel transistor 6. A gate and drain of the P-channel transistor 6 are commonly connected to the ground and the transistor 6 functions as a resistive element having a predetermined resistance value.

The driver circuit D includes an N-channel transistor 7, a P-channel transistor 8, and P-channel transistor 9 which are connected in series between the power supply VDD and the ground. The N-channel transistor 7 has a gate connected to the output note $n_2$ of the second bias voltage circuit $B_2$, a drain connected to the power supply VDD, and a source connected to a source of the P-channel transistor 8, the connection point of which forms an output terminal for taking out the output voltage $V_o$. The P-channel transistor 8 is supplied the input voltage $V_i$ at its gate, and has a drain connected to a source of the P-channel transistor 9. A gate and source of the P-channel transistor 9 are commonly connected to the ground and the transistor 9 functions as a resistive element having a predetermined resistance value.

All of the transistors of the level shift circuit are constituted in enhancement type, and the level shift circuit is designed such that the P-channel transistors 2 and 5 of the first and second bias voltage supply circuits $B_1$ and $B_2$ and the N-channel transistor 7 of the driver circuit D slightly turn on, when the input signal $V_i$ is supplied to the input terminal INPUT.

Next, the operation of the level shift circuit shown in FIG. 2 will be described. When the first bias voltage supply circuit $B_1$ receives the input voltage $V_i$, a voltage $V_{n1}$ is generated at the node $n_1$. In this event, a gate-source voltage $V_{GS2}$ of the P-channel transistor 2 is expressed by:

$$V_{GS2}=V_i-V_{n1} \qquad (7)$$

On the other hand, since the transistor 2 is slightly turn on when the input voltage is supplied as described above, the gate-source voltage $V_{GS2}$ can be expressed by:

$$V_{GS2}=V_{tp}+\alpha_1 \qquad (8)$$

In Equation (8), $V_{tp}$ is a threshold voltage of the P-channel enhancement transistor 2($V_{tp}<0$), and $\alpha_1<0$. For example, when $\alpha_1$ is selected to be in a range from −0.4 V to −0.2 V, $V_{GS2}$ is in a range from −1.1 V to −0.9 V (i.e. −1.1 V≦$V_{GS2}$≦−0.9) since $V_{tp}$ is generally −0.7 volts.

From Equations (7) and (8), the voltage $V_{n1}$ of the node $n_1$ is expressed as follows:

$$V_{n1}=V_i-V_{tp}-\alpha_1 \quad (9)$$

The voltage $V_{n1}$ from the first bias voltage supply circuit $B_1$ is then supplied to the second bias voltage supply circuit $B_2$, where a voltage $V_{n2}$ expressed by the following Equation (10) is generated at the node $n_2$:

$$V_{n2}=V_i-2V_{tp}-\alpha_1-\alpha_2 \quad (10)$$

In Equation (10), $\alpha_2$ is a negative voltage to set a source-gate voltage $V_{GS5}$ of the P-channel transistor 5 equal to $V_{tp}$ plus $\alpha_2$ (i.e. $V_{GS5}=V_{tp}+\alpha_2$) so that the transistor 5 slightly turns on. For example, when $\alpha_2$ is set to be in a range from −0.4 V to −0.2, $V_{GS5}$ is in a range from −1.1 V to −0.9 V (i.e. $-1.1 \leq V_{GS5} \leq -0.9$).

Further, when the voltage $V_{n2}$ from the second bias voltage supply circuit $B_2$ is supplied to the driver circuit D, the output voltage $V_o$, as expressed by the following Equation (11), is produced from the output terminal OUTPUT or the sources of the N- and P-channel transistors 7 and 8:

$$V_o=V_i-2V_{tp}-\alpha_1-\alpha_2-(V_{tn}+\gamma) \quad (11)$$

In Equation (11), $V_{tn}$ is a positive threshold voltage of the N-channel enhancement transistor 7, and $\gamma$ is a positive voltage for setting a source-gate voltage $V_{GS7}$ of the transistor 7 equal to $V_{tn}$ plus $\gamma$ (i.e. $V_{GS7}=V_{tn}+\gamma$) so that the transistor 7 slightly turns on. For example, when $\gamma$ is set to be in a range from 0.2 V to 0.4 V, $V_{GS7}$ is in a range from 0.9 V to 1.1 V (i.e. $0.9 \leq V_{GS7} \leq 1.1$).

From Equation (11), the level shift amount $V_{sh}$ in the level shift circuit of FIG. 2 is apprently expressed by:

$$V_{sh}=-(2V_{tp}+\alpha_1+\alpha_2)-(V_{tn}+\gamma) \quad (12)$$

For example, when it is designed to satisfy $|V_{tp}|=V_{tn}=0.7V$ and $-(\alpha_1+\alpha_2)-\gamma=0.3V$, $V_{sh}$ is equal to 1 V, thus providing a level shift amount of one volt. In addition, by appropriately selecting the sizes of the respective transistors to change $V_{tp}$, $\alpha_1$, $\alpha_2$, $V_{tn}$, $\gamma$, the level shift amount $V_{sh}$ can be set to a variety of values. Further, if the number of cascaded stages of the bias voltage supply circuits is increased to "m", the level shift circuit can provide a larger level shift amount $V_{sh1}$ as expressed by:

$$V_{sh1}=-(mV_{tp}+\alpha_1+\alpha_2+C_3+\ldots+\alpha_m)-(V_{tn}+\gamma) \quad (13)$$

[where, $\alpha_3, \ldots, \alpha_m < 0$]

In a level shift circuit of a MOSFET type, there are stray capacitances between an output terminal and a power supply VDD and/or the ground. Therefore, an output voltage increases or decreases to a desired or appropriate voltage with delay time because of these stray capacitances.

In addition, a capacitive load is generally connected to the output terminal. The level shift circuit shown in FIG. 2 generally connects to such a capacitive load, and when the output voltage at the output terminal OUTPUT or a charged voltage of a capacitive load is lower than the desired final voltage value $V_o$, the gate-source voltage $V_{GS7}$ of the N-channel transistor 7 is large enough to turn on the transistor 7. Thus, the transistor 7 can flow a large current from the power supply VDD to rapidly charge the capacitive load to the desired voltage $V_o$. Conversely, when the charged voltage of the capacitive load is higher than the desired voltage value $V_o$, a gate-source voltage $V_{GS8}$ of the P-channel transistor 8 is large enough to flow a large discharge current from the capacitive load through the transistor 8. The level shift circuit illustrated in FIG. 2 is therefore possible to rapidly provide the desired output voltage $V_o$ at the capacitive load.

The driver circuit D is designed such that the N-channel transistor 7 slightly turn on in a normal state as described above. When the voltage at the output terminal (or the charged voltage on the load) is equal to the desired output voltage $V_o$, a DC current flowing through the driver circuit D is extremely small. Therefore it can reduce the power consumption. Reducing power consumption is also realized in the first and second bias voltage supply circuits $B_1$ and $B_2$. This is because the P-channel transistors 2, 5 of these circuits $B_1$, $B_2$ slightly turn on in the normal state, similarly to the N-channel transistor 7 of the driver circuit D, so that DC currents flowing through these circuits are extremely small.

Figure 1:
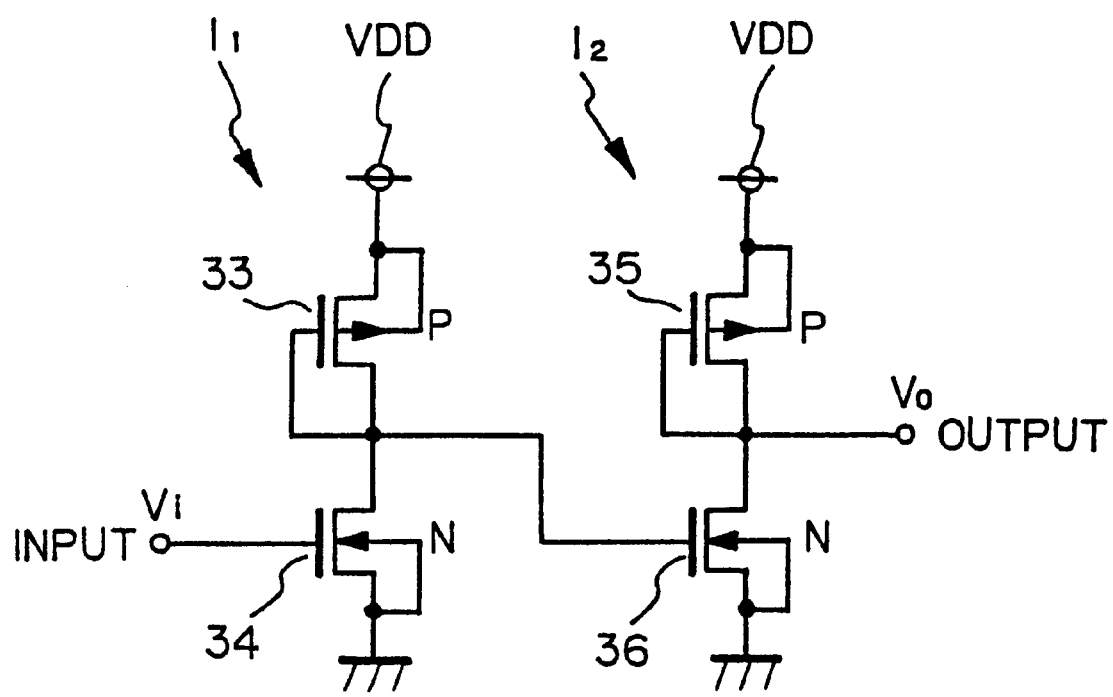
FIG. 1 is a circuit diagram illustrating a prior art level shift circuit.

A test was conducted for the level shift circuit of the present invention illustrated in FIG. 2 and the prior art level shift circuit illustrated in FIG. 1 under the following conditions, with a capacitive load connected to the output terminal of each circuit:

Power Supply Voltage; $V_{dd}$=5V

Operating Frequency; f=100KHz (1 cycle=10$\mu$s)

Load Capacitance; $C_L$=5pF

Input Voltage; $V_i$=2.5V

Desired Output Voltage; $V_o$=3.5V (i.e., Level Shift Amount; $V_{sh}$=1V)

The result of the test showed that in the prior art level shift circuit of FIG. 1, DC currents constantly flowed through the inverters $I_1$, $I_2$ even after the output voltage of 3.5 V was obtained, and the total value of the currents was approximately 1 mA.

On the other hand, in the level shift circuit of the present invention, a current of approximately 1 mA (=1000 $\mu$A) flowed from the power supply of 5 V when the output or charged voltage was under the desired voltage $V_o$ (=3.5 V), (i.e. until the capacitive load was charged to 3.5 V, while after the output voltage reached the desired voltage of 3.5 V, the current was approximately 17,5 $\mu$A. It was therefore demonstrated that the present invention can significantly reduce a consumed current after a desired output voltage is provided, as compared with the prior art example.

In addition, in the test using the level shift circuit of the present invention, it took only 0.5 $\mu$s until the capacitive load was charged to 3.5 V. Thus, the current of approximately 1 mA flowed only within 1/200 (=5$\mu$s /10$\mu$s) of a cycle, whereas the current of only approximately 17,5 $\mu$A flowed in the remaining 199/200 fraction of the cycle. Furthermore, actually, once a capacitive load is charged to a desired output voltage, it is not necessary to subsequently supply a charge current to the capacitive load. Thus, in the present invention, the current of 17,5 $\mu$A substantially flows in subsequent cycles, thereby making it possible to suppress the consumed current to about 1/57 (=17,5$\mu$A /1000$\mu$A) as much as the prior art example.

Figure 3:
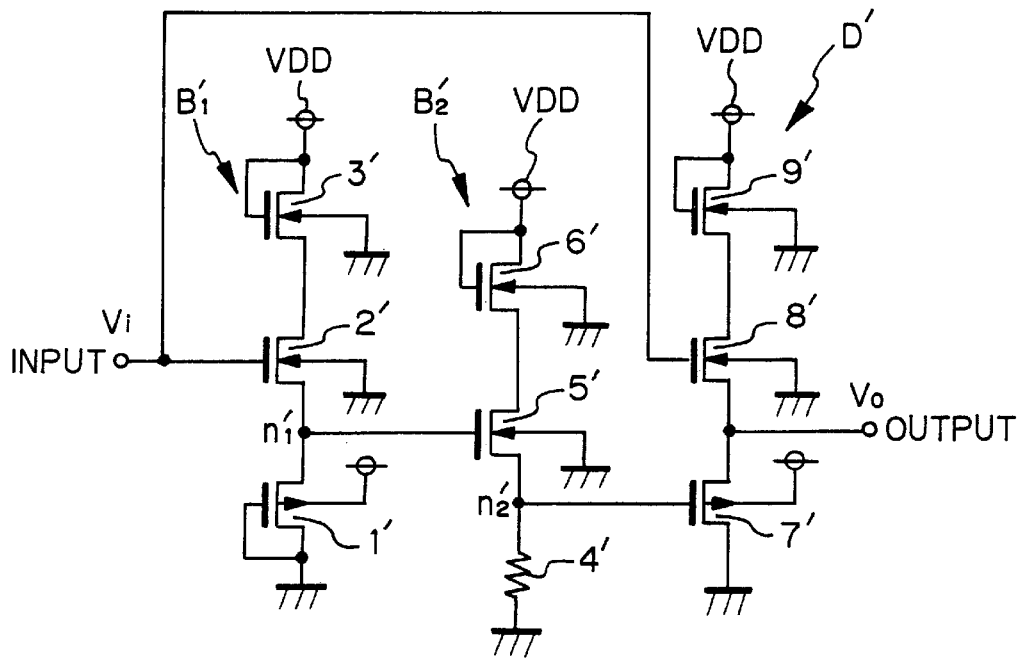
FIG. 3 is a circuit diagram illustrating a second embodiment of the level shift circuit according to the present invention.

FIG. 3 illustrates a second preferred embodiment of the level shift circuit according to the present invention. The level shift circuit of FIG. 3 is a so-called complementary circuit of that of in FIG. 2, wherein the elements employed in the level shift circuit of FIG. 2 are replaced by complementary elements. More specifically, the level shift circuit of FIG. 3 is configured in such a manner that: (a) the P-channel transistors in the level shift circuit of FIG. 2 are replaced by N-channel transistors, and the N-channel transistors in the level shift circuit of FIG. 2 are replaced by P-channel transistors; and (b) the power supply VDD and the ground are connected in a manner reverse to FIG. 2. In FIG. 3, elements complementary to those of FIG. 2 are designated the same reference numerals used in FIG. 2, with a prime "'" added thereto.

In the level shift circuit of FIG. 3, an output voltage $V_o$ is expressed by:

$$V_o = V_i - (2V_{tn} + \alpha_1' + \alpha_2') - (V_{tp} + \gamma') \quad (14)$$

Also in the level shift circuit of FIG. 2, assuming that the number of cascaded stages of the bias voltage supply circuits is "m", the output voltage $V_o$ is expressed by:

$$V_o = V_i - (mV_{tn} + \alpha_1' + \alpha_2' \ldots + \alpha_m') - (V_{tp} + \gamma') \quad (15)$$

[where $\alpha_1', \alpha_2', \ldots \alpha_m' > 0$, and $\gamma' < 0$]

It can be seen from Equation (15) that a larger level shift amount can be provided similar to that of the embodiment, the output voltage of which is expressed by Equation (13). It could be obviously understood by those skilled in the field that other meritorious effects or advantages similar to those of the first embodiment also be derived in the second embodiment.

Figure 4:
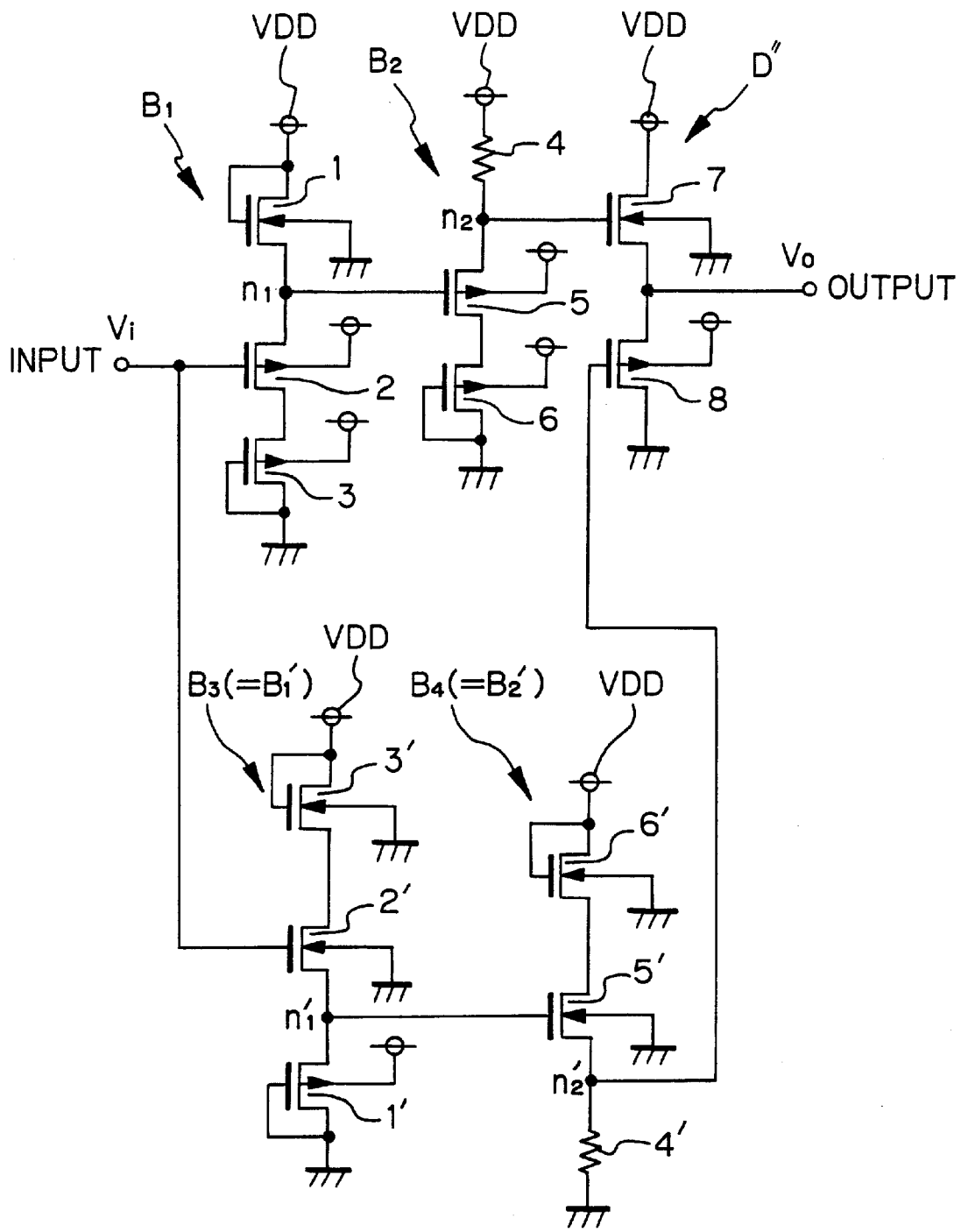
FIG. 4 is a circuit diagram illustrating a third embodiment of the level shift circuit according to the present invention.

FIG. 4 illustrates a level shift circuit according to a third preferred embodiment of the present invention. The circuit is constituted by modifying the level shift circuit shown in FIG. 2 such that the P-channel transistor 9 of the driver circuit D is removed, and the P-channel transistor 8 is driven by newly added third and fourth bias voltage supply circuits $B_3$ and $B_4$. It should be noted that the third and fourth bias voltage supply circuits $B_3$, $B_4$ have the same configurations as the first and second bias voltage supply circuits $B_1'$ and $B_2'$ of the second preferred embodiment illustrated in FIG. 3, so that elements constituting the third and fourth voltage supply circuits are also designated the same reference numerals used in FIG. 3.

In the level shift circuit of FIG. 4, an output voltage $V_o$ is expressed by:

$$V_o = V_i - (2V_{tp} + \alpha_1 + \alpha_2) - (V_{tn} + \gamma) = V_i - (2V_{tn} + \alpha_1' + \alpha_2') - (V_{tp} + \gamma') \quad (16)$$

In the level shift circuit of FIG. 4, it goes without saying that an increased number "m" of cascaded stages of bias voltage supply circuits indicates that the level shift amount becomes larger. Other meritorious effects or advantages similar to those of the first and second embodiments can also be produced in the third embodiment. It should be noted that the numbers of bias voltage supply circuits placed in front of the N-channel transistor 7 and the P-channel transistor 8 are not required to be the same.

Of course, a variety of other modifications and changes can be made in the present invention. For example, similar meritorious effects can be produced when the N-channel transistor 1 and the P-channel transistors 3, 6, 9 in FIG. 2 are replaced by resistors. Conversely, the resistor 4 may be implemented by a MOSFET. Further, a resistor may be inserted between the power supply VDD and the N-channel transistor 7. These modifications may be applied likewise to the configurations in FIGS. 3 and 4.

As described above, the level shift circuit of the present invention can readily set a larger level shift amount and rapidly provide an output voltage equal to a desired value. In addition, after the desired voltage value is attained, a current passing through the level shift circuit from the power supply to the ground is extremely small, thereby making it possible to significantly reduce power consumption as compared with a prior art.

While preferred embodiments have been described, variations thereto will occur to those skilled in the field within the scope of the present inventive concepts which are delineated by the following claims.

What is claimed is:

1. A level shift circuit consisting MOS transistors which shifts a level of an input voltage supplied to an input terminal thereof and provides a level shifted output voltage from an output terminal thereof, comprising:

driver means including a first transistor of a first channel type and a second transistor of a second channel type, wherein said first transistor is serially connected with said second transistor, a gate of said first transistor is connected to said input terminal, and sources of said first and second transistors are connected to said output terminal; and first bias voltage supply means connected between said input terminal and a gate of said second transistor, for shifting the level of the input voltage to supply the level shifted voltage to said gate of said second transistor of said driver means.

2. A level shift circuit according to claim 1, wherein:

said first bias voltage supply means includes a m number of circuits cascaded between said input terminal and said gate of said second transistor, said m being two or more;

each of said circuits of said first bias voltage supply means comprises a series connection of a first resistive element functioning as a load resistor, a transistor of said first channel type, and a second resistive element functioning as an electric resistor;

a gate of the transistor of a first stage circuit of said m number of circuits is connected to said input terminal;

a connection point between a source of the transistor and the first resistive element of an i-th (i=1, 2, ..., m−1) stage circuit is connected to a gate of the transistor of an (i+1)-th stage circuit; and a connection point between a source of the transistor and the first resistive element of the m-th stage circuit is connected to the gate of said second transistor.

3. A level shift circuit according to claim 2, wherein:

said first channel type is a P-channel, and said second channel type is an N-channel; and a drain of said second transistor is connected to a positive terminal of a power supply voltage.

4. A level shift circuit according to claim 3, wherein:

said first resistive element comprises an N-channel transistor having a gate and a drain connected to each other; and said second resistive element comprises a P-channel transistor having a gate and a drain connected to each other.

5. A level shift circuit according to claim 2, wherein:

said first channel type is an N-channel, and said second channel type is a P-channel; and a drain of said second transistor is connected to a negative terminal of a power supply voltage.

6. A level shift circuit according to claim 5, wherein:

said first resistive element comprises a P-channel transistor having a gate and a drain connected to each other; and said second resistive element comprises an N-channel transistor having a gate and a drain connected to each other.

7. A level shift circuit according to claim 1, wherein:

said first channel type is a P-channel, and said second channel type is an N-channel; and a drain of said second transistor is connected to a positive terminal of a power supply voltage.

8. A level shift circuit according to claim 3, further comprising second bias voltage supply means having m stages of circuits inserted between said input terminal and a gate of said first transistor, said m being two or more, wherein:

each of said circuits of said second bias voltage supply means includes a series connection of a fourth resistive element functioning as a load resistor, an N-channel transistor, and a fifth resistive element functioning as an electric load;

a gate of the transistor of a first stage circuit of said m number of circuits of said second bias voltage supply means is connected to said input terminal;

a connection point between a source of the transistor and the fourth resistive element of the i-th (i=1, 21 ..., m−1) stage circuit of said second bias voltage supply means is connected to a gate of the transistor of the (i+1)-th stage circuit thereof; and a connection point between a source of the transistor and the fourth resistive element of the m-th stage circuit of said second bias voltage supply means is connected to the gate of said first transistor.

9. A level shift circuit according to claim 8, wherein:

said fourth resistive element comprises a P-channel transistor having a gate and a source connected to each other; and said fifth resistive element comprises an N-channel transistor having a gate and a source connected to each other.

10. A level shift circuit according to claim 1, wherein:

said first channel type is an N-channel, and said second channel type is a P-channel; and a drain of said second transistor is connected to a negative terminal of a power supply voltage.

11. A level shift circuit according to claim 1, wherein said driver means further includes a third resistive element connected in series to a drain of said first transistor.

12. A level shift circuit according to claim 11, wherein said third resistive element comprises a transistor of said first type having a gate and a drain connected to each other.

13. A level shift circuit consisting MOS transistors which shifts a level of an input voltage supplied to an input terminal thereof and provides a level shifted output voltage from an output terminal thereof, comprising:

driver circuit including a first transistor of a first channel type and a second transistor of a second channel type, wherein said first transistor is serially connected with said second transistor, a gate of said first transistor is connected to said input terminal, and sources of said first and second transistors are connected to said output terminal; and bias voltage supply circuit connected between said input terminal and a gate of said second transistor, which shifts the level of the input voltage to supply the level shifted voltage to said gate of said second transistor of said driver circuit.

* * * * *